US008287059B2

(12) United States Patent  (10) Patent No.: US 8,287,059 B2
Yang  (45) Date of Patent: Oct. 16, 2012

(54) RAIL DEVICE AND SERVER

(75) Inventor: Chi-Chun Yang, Taipei (TW)

(73) Assignee: Inventec Corporation, Taipei (TW)

( * ) Notice: Subject to any disclaimer, the term of this patent is extended or adjusted under 35 U.S.C. 154(b) by 347 days.

(21) Appl. No.: 12/727,455

(22) Filed: Mar. 19, 2010

(65) Prior Publication Data

US 2011/0100935 A1  May 5, 2011

(30) Foreign Application Priority Data

Nov. 4, 2009 (TW) ................................ 98137475 A

(51) Int. Cl.
A47B 88/00 (2006.01)
(52) U.S. Cl. ................. 312/334.44; 312/333; 312/334.6
(58) Field of Classification Search .................... 211/26, 211/126.15, 151, 162; 312/223.1, 265.1–265.4, 312/333, 334.1, 334.44, 334.46, 334.7, 334.8; 384/21
See application file for complete search history.

(56) References Cited

U.S. PATENT DOCUMENTS

| | | | | |
|---|---|---|---|---|
| 2,277,702 A * | 3/1942 | Kennedy | ................ | 312/334.8 |
| 2,277,703 A * | 3/1942 | Kennedy et al. | ................ | 384/21 |
| 3,133,768 A * | 5/1964 | Klakovich | ................ | 384/17 |
| 3,589,778 A * | 6/1971 | Olson | ................ | 384/21 |
| 4,440,461 A * | 4/1984 | Powell et al. | ................ | 312/334.8 |
| 4,872,734 A * | 10/1989 | Rechberg | ................ | 312/333 |
| 6,238,031 B1 * | 5/2001 | Weng | ................ | 312/333 |
| 6,375,290 B1 * | 4/2002 | Lin et al. | ................ | 312/334.46 |
| 6,424,534 B1 * | 7/2002 | Mayer et al. | ................ | 361/724 |
| 6,588,866 B2 * | 7/2003 | Cheng | ................ | 312/334.7 |
| 6,601,933 B1 * | 8/2003 | Greenwald | ................ | 312/333 |
| 6,626,300 B2 * | 9/2003 | Kaminski et al. | ................ | 211/26 |
| 6,979,067 B2 * | 12/2005 | Yang | ................ | 312/334.46 |
| 7,008,030 B2 * | 3/2006 | Yang | ................ | 312/334.46 |
| 7,178,888 B2 * | 2/2007 | Judge et al. | ................ | 312/334.46 |
| 7,347,516 B2 * | 3/2008 | Hay | ................ | 312/333 |
| 7,404,611 B1 * | 7/2008 | Que | ................ | 312/334.46 |
| 7,604,307 B2 * | 10/2009 | Greenwald et al. | ................ | 312/333 |
| 7,780,254 B2 * | 8/2010 | Wang et al. | ................ | 312/334.7 |
| 7,823,995 B2 * | 11/2010 | Duan et al. | ................ | 312/333 |
| 7,848,110 B2 * | 12/2010 | Du et al. | ................ | 361/727 |
| 8,007,060 B2 * | 8/2011 | Duan et al. | ................ | 312/334.44 |
| 2002/0084735 A1 * | 7/2002 | Liang et al. | ................ | 312/334.46 |
| 2003/0209958 A1 * | 11/2003 | Hwang et al. | ................ | 312/334.46 |
| 2004/0012313 A1 * | 1/2004 | MacMillan | ................ | 312/334.44 |
| 2005/0029913 A1 * | 2/2005 | He | ................ | 312/334.44 |
| 2008/0218046 A1 * | 9/2008 | Rechberg | ................ | 312/334.11 |
| 2009/0026904 A1 * | 1/2009 | Hsiung et al. | ................ | 312/334.46 |
| 2009/0115300 A1 * | 5/2009 | Chen et al. | ................ | 312/334.1 |
| 2011/0100934 A1 * | 5/2011 | Hsu | ................ | 211/26 |
| 2011/0100935 A1 * | 5/2011 | Yang | ................ | 211/26 |
| 2011/0100936 A1 * | 5/2011 | Chang et al. | ................ | 211/26 |

* cited by examiner

Primary Examiner — Darnell Jayne
Assistant Examiner — Joshua Rodden
(74) Attorney, Agent, or Firm — J.C. Patents

(57) ABSTRACT

A rail device and a server are provided. The server includes a rack, at least one chassis, and a rail device. The rail device is disposed on the chassis and the rack to move the chassis between a first position and a second position relative to the rack. The rail device includes a first rail, a second rail, a bracket, and a first latch. The first rail is installed on the rack, the second rail is installed in the chassis, the bracket is slidably coupled to the first rail and the second rail, and the first latch is disposed on the bracket. When the chassis moves away from the first position, the first latch locks the bracket and the chassis together, so that the chassis pushes the bracket forward.

6 Claims, 6 Drawing Sheets

RAIL DEVICE AND SERVER

CROSS-REFERENCE TO RELATED APPLICATION

This application claims the priority benefit of Taiwan application serial no. 98137475, filed on Nov. 4, 2009. The entirety of the above-mentioned patent application is hereby incorporated by reference herein and made a part of this specification.

BACKGROUND OF THE INVENTION

1. Field of the Invention

The invention relates to a rail device. More particularly, the invention relates to a rail device applicable to a server.

2. Description of Related Art

Currently, an industrial server allows a user to control the operation of peripheral equipment or machines. In the server, a chassis having two side walls is utilized, a bottom of the chassis is connected between the two side walls, and an accommodation space capable of accommodating hardware equipment including a power source, various circuit boards, and a disk array is formed between the two side walls. After the hardware equipment including the power source, the circuit boards, and the disk array is installed in the chassis, the chassis must be placed into a chassis cabinet for the user to control the operation of the peripheral equipment.

The aforesaid chassis is disposed on a fixed-type L-shaped rack in the chassis cabinet. Given that the hardware equipment within the chassis is damaged or needs to be expanded, the chassis must be disassembled from the L-shaped rack, and the hardware equipment in the chassis can then be repaired or expanded. After the repair or expansion is done, the chassis must be assembled back to the L-shaped rack in the chassis cabinet, which creates inconvenience to maintenance and expansion of the hardware equipment.

Accordingly, some manufacturers modify the L-shaped rack to make retractable rails. When the hardware equipment in the chassis is damaged or needs to be expanded, the chassis can be directly pulled out from the chassis cabinet, and the hardware equipment in the chassis can then be repaired or expanded. After the repair or expansion of the hardware equipment in the chassis is done, the chassis is pushed back to the chassis cabinet, and the maintenance or expansion of the hardware equipment is completed.

Although the aforesaid rails facilitate the maintenance or expansion of the hardware equipment in the chassis, said rails occupy internal space of the chassis cabinet, i.e. internal space in the chassis cabinet is reduced, such that installation of the hardware equipment in the chassis cannot go smoothly, or that expandability of the server is adversely affected because less hardware equipment can be installed in the chassis.

SUMMARY OF THE INVENTION

The invention is directed to a rail device with a new structure.

The invention is further directed to a server having a chassis with relatively large usable space.

In an embodiment of the invention, a rail device adapted to a server is provided. The server includes a rack and at least one chassis. The rail device is disposed on the chassis and the rack to move the chassis between a first position and a second position relative to the rack. The rail device includes a first rail, a second rail, a bracket, and a first latch. The first rail is installed on the rack, the second rail is installed in the chassis, the bracket is slidably coupled to the first rail and the second rail, and the first latch is disposed on the bracket. When the chassis moves away from the first position, the first latch locks the bracket and the chassis together, so that the chassis pushes the bracket forward.

In an embodiment of the invention, a server including a rack, at least one chassis, and a rail device is provided. The rail device is disposed on the chassis and the rack to move the chassis between a first position and a second position relative to the rack. The rail device includes a first rail, a second rail, a bracket, and a first latch. The first rail is installed on the rack. The second rail is installed in the chassis. The bracket is slidably coupled to the first rail and the second rail. The first latch is disposed on the bracket. When the chassis moves away from the first position, the first latch locks the bracket and the chassis together, such that the chassis pushes the bracket forward.

According to an embodiment of the invention, the first rail has a first stopper. When the chassis pushes the bracket forward and moves the bracket to the second position, the first stopper blocks movement of the bracket.

According to an embodiment of the invention, the bracket includes a slide block and a supporter. The slide block is slidably disposed at the first rail. The supporter has a first end and a second end. The first end is mounted onto to the slide block, and the second end is slidably disposed at the second rail. The first latch is disposed on the supporter.

According to an embodiment of the invention, the rail device further includes a driver and a second latch. The driver is slidably disposed at the first rail and slidably coupled to the supporter. The second latch is disposed at the first rail and located on a moving path of the slide block and the driver. The second latch has a second stopper and a pressing portion. When the chassis moves from the second position to the first position, the second stopper blocks the slide block from moving to the first position of the chassis. When the driver contacts the pressing portion, the second latch unlocks the slide block.

According to an embodiment of the invention, the first latch has a buckling portion, and the chassis has an opening. When the chassis moves between the first position and the second position, the buckling portion is fastened to the opening. When the chassis moves to the second position, the buckling portion is moved away from the opening, such that the chassis is disassembled from the supporter.

Based on the above, the rail device includes the first rail disposed on the rack and the second rail disposed in the chassis according to the above embodiments of the invention, and the bracket is coupled to both the first rail and the second rail. Thereby, the chassis of the server can have relatively large usable space therein, and the chassis can be slidably pulled out from or pushed into the rack.

It is to be understood that both the foregoing general descriptions and the following detailed embodiments are exemplary and are, together with the accompanying drawings, intended to provide further explanation of technical features and advantages of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
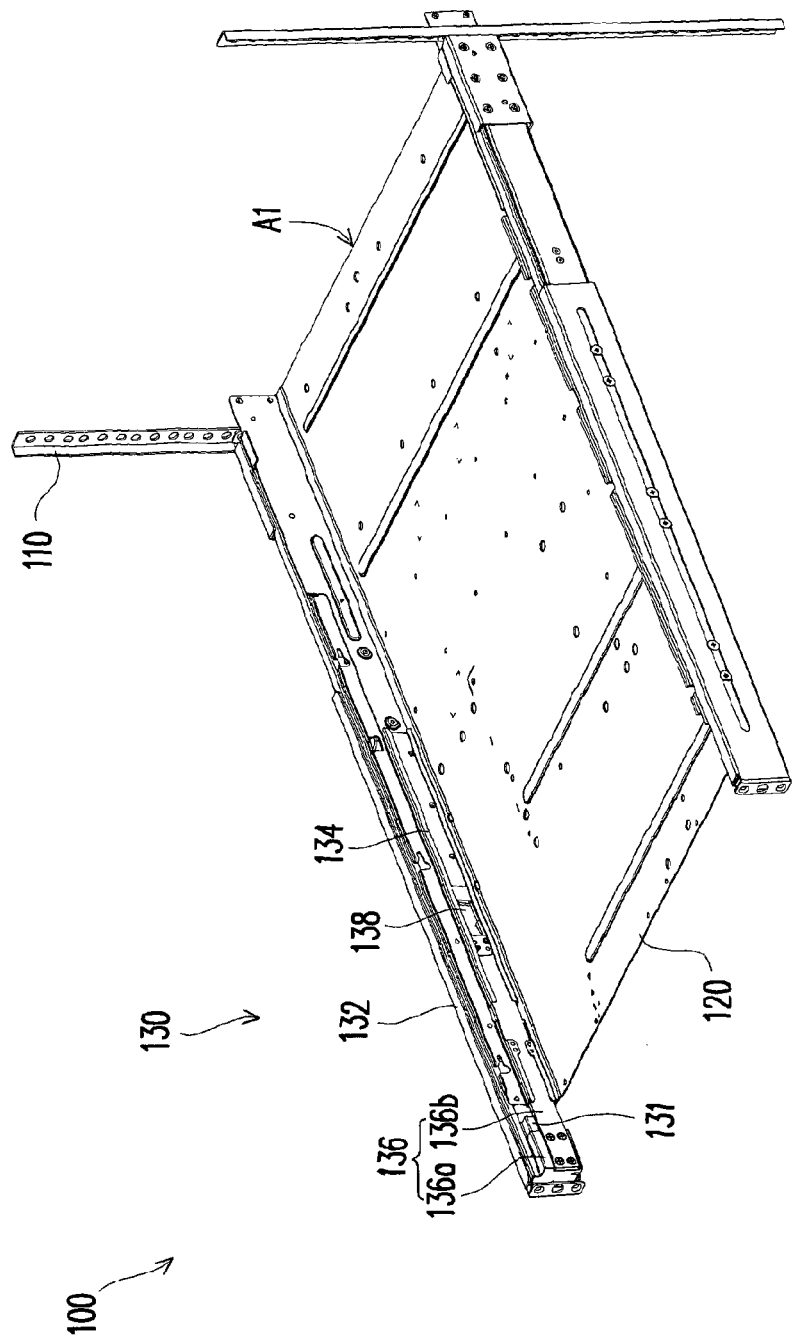
FIG. 1 is a schematic view illustrating a server according to an embodiment of the invention.
Figure 2:
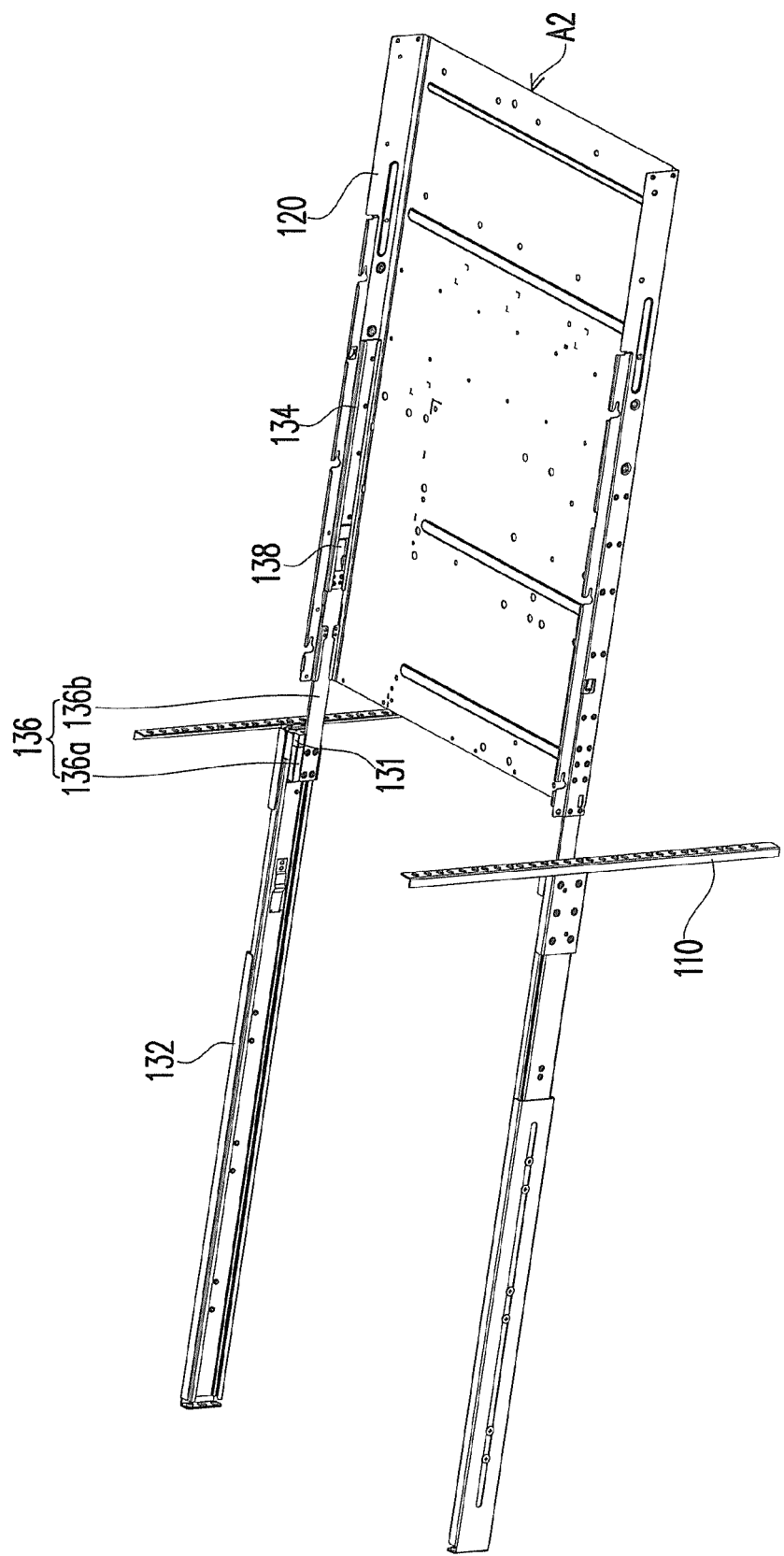
FIG. 2 is a schematic view illustrating the server depicted in FIG. 1 at another view angle.

FIG. 1 is a schematic view illustrating a server according to an embodiment of the invention. FIG. 2 is a schematic view illustrating the server depicted in FIG. 1 at another view angle. FIGS. 1 and 2 respectively illustrate the state of a chassis of the server at different locations. With reference to FIGS. 1 and 2, the server 100 of this embodiment includes a rack 110, a chassis 120, and a rail device 130. To better describe the invention, only one chassis 120 is taken for example, while the number of the chassis 120 in the server 100 is not limited in the invention. The rail device 130 is disposed on the rack 110 and the chassis 120 to move the chassis 120 between a first position A1 in FIG. 1 and a second position A2 in FIG. 2 relative to the rack 110.

Even though the rail devices 130 are disposed in pairs on the rack 110 and the chassis 120, only the rail device 130 at one side of the chassis 120 is described herein, and descriptions of the rail device 130 at the other side of the chassis 120 are omitted. In this embodiment, the rail device 130 includes a first rail 132, a second rail 134, a bracket 136, and a first latch 138. The first rail 132 is disposed on the rack 110, and the second rail 134 is disposed in the chassis 120. The bracket 136 is slidably coupled to the first rail 132 and the second rail 134. The first latch 138 is disposed on the bracket 136. When the chassis 120 moves away from the first position A1, the first latch 138 locks the bracket 136 and the chassis 120 together, such that the chassis 120 pushes the bracket 136 forward, and that the bracket 136 moves along the first rail 132.

Based on the above, the rails are categorized into the first rail 132 disposed on the rack 110 and the second rail 134 disposed in the chassis 120 according to this embodiment. Hence, the chassis 120 of the server 100 in this embodiment has relatively large internal space, such that the chassis 120 includes large capacity and movability as its special features.

Figure 3:
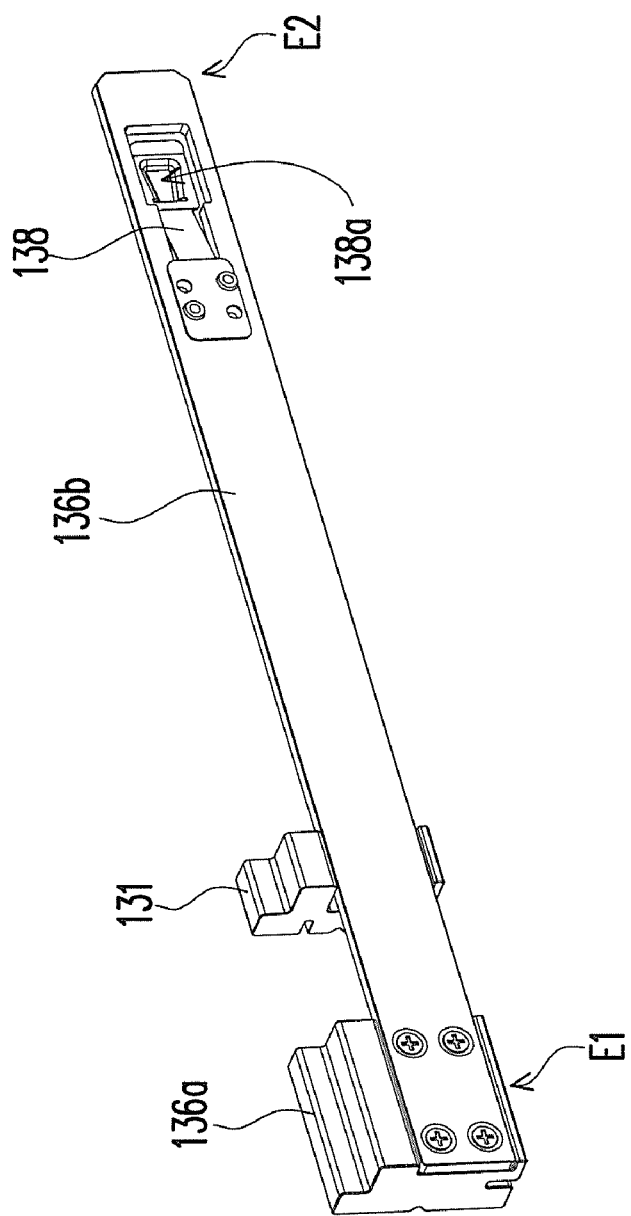
FIG. 3 is a schematic view illustrating partial components in the server depicted in FIG. 1.

Further explanations are provided below with reference to FIG. 3. FIG. 3 is a schematic view illustrating partial components in the server depicted in FIG. 1. As shown in FIGS. 1 and 3, according to this embodiment, the bracket 136 includes a slide block 136a and a supporter 136b, and the slide block 136a is slidably disposed at the first rail 132. The supporter 136b has a first end E1 and a second end E2. The first end E1 is mounted onto to the slide block 136a, and the second end E2 is slidably disposed at the second rail 134. The first latch 138 is disposed on the supporter 136b.

Figure 4:
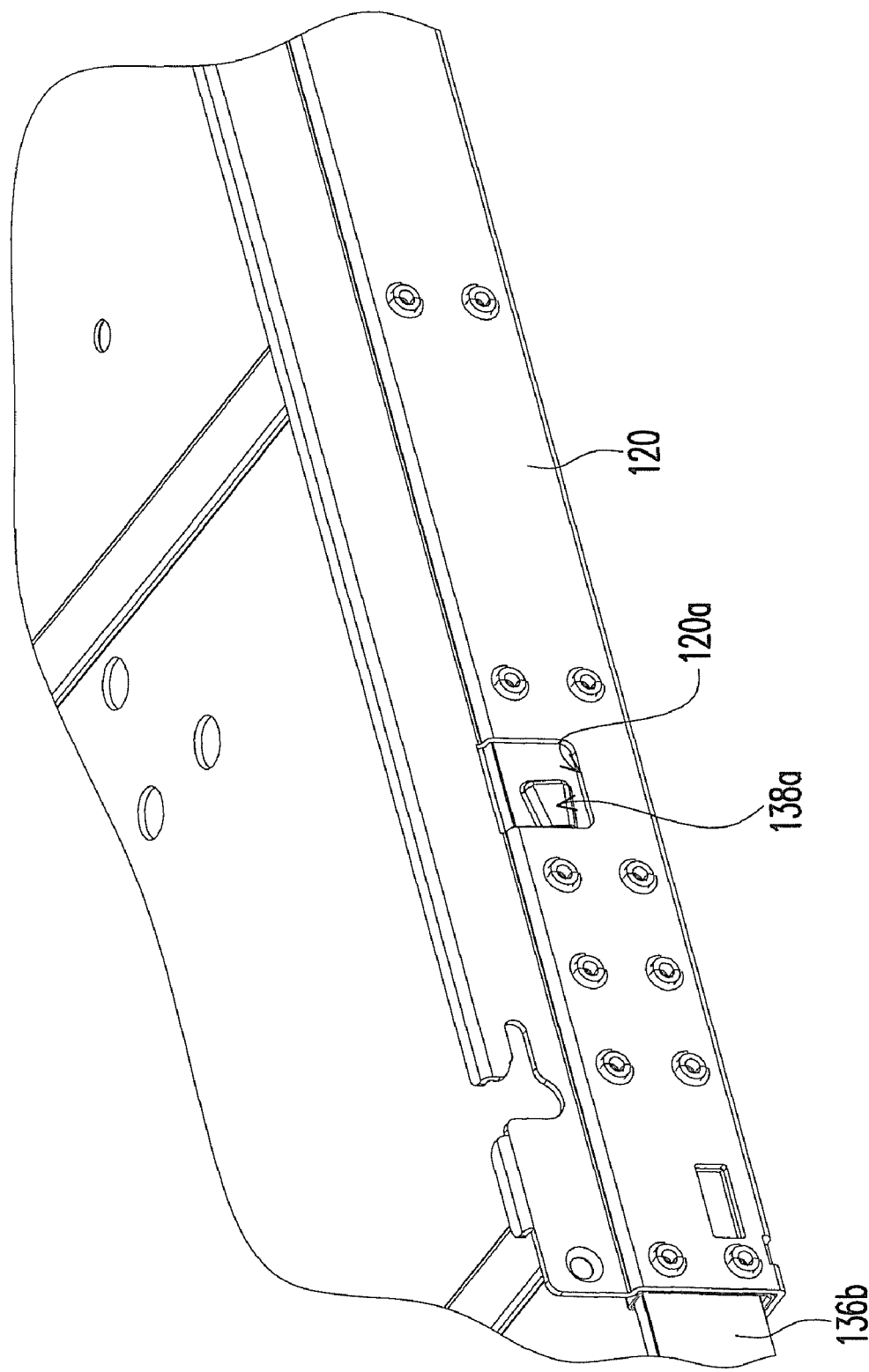
FIG. 4 is a partial enlarged view illustrating the server depicted in FIG. 1.

FIG. 4 is a partial enlarged view illustrating the server depicted in FIG. 1. To clearly illustrate the buckling relation between the chassis 120 and the first latch 138, the first rail 132 is not depicted in FIG. 4. In FIGS. 3 and 4, the first latch 138 is, for example, an elastic sheet of which one side is mounted onto the supporter 136b and the other side is extended toward the chassis 120 from the supporter 136b and compressed by the chassis 120. Note that the first latch 138 has a buckling portion 138a, and the chassis 120 has an opening 120a. When the chassis 120 moves away from the first position A1 depicted in FIG. 1 at a distance, the opening 120a corresponds to the buckling portion 138a. Therefore, the buckling portion 138a of the first latch 138 is fastened to the opening 120a of the chassis 120 because of an elastic force, such that the chassis 120 and the supporter 136b are locked together. Further, when a user pulls out the chassis 120, the bracket 136 can also be driven to move.

On the other hand, when the chassis 120 is completely pulled out from the rack 110 (depicted in FIG. 1) and arrives at the second position A2 depicted in FIG. 2, the chassis 120 respectively pushes against the second rail 134 and the first rail 132 via the supporter 136b and the slide block 136a, such that the chassis 120 stays on the rail device 130. When the chassis 120 is to be disassembled from the rail device 130, the buckling portion 138a of the first latch 138 is pressed and removed from the opening 120a of the chassis 120. Thereby, the first latch 138 unlocks the chassis 120.

Figure 5:
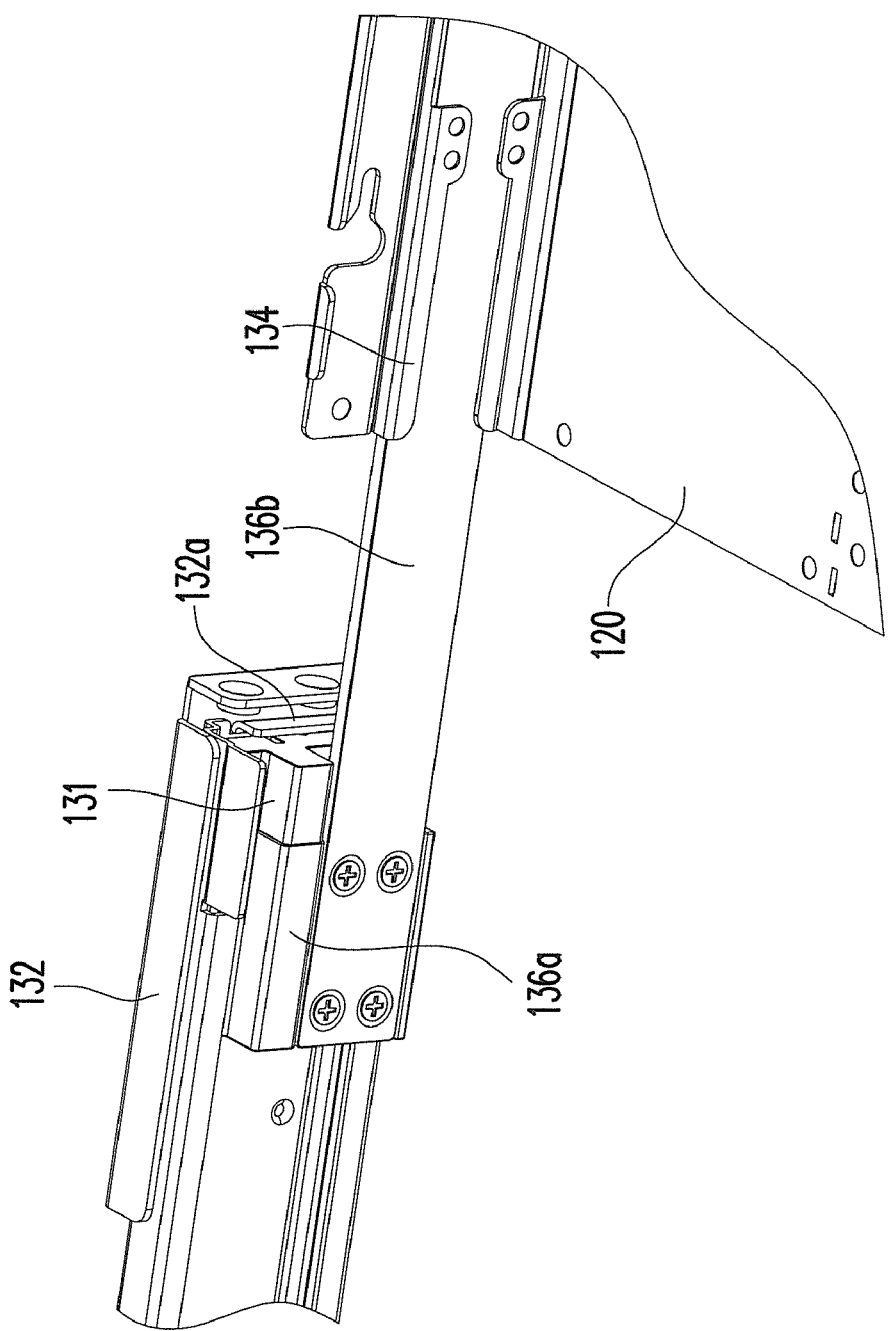
FIG. 5 is a partial enlarged view illustrating the server depicted in FIG. 2.

See FIGS. 2 and 3. The rail device 130 further includes a driver 131 slidably disposed at the first rail 132 and slidably coupled to the supporter 136. Besides, please refer to FIG. 5. FIG. 5 is a partial enlarged view illustrating the server depicted in FIG. 2. To clearly illustrate the correlation between the first rail and the driver, the rack 110 is not depicted in FIG. 5. In FIGS. 2, 3, and 5, the first rail 132 has a first stopper 132a. When the chassis 120 moves from the first position A1 depicted in FIG. 1 to the second position A2 depicted in FIG. 2, the slide block 136a of the bracket 136 and the driver 131 are driven by the chassis 120 to move along the first rail 132. When the chassis 120 moves to the second position A2, the first stopper 132a of the first rail 132 interferes with the driver 131, so as to block the slide block 136a and the driver 131 from moving. Thereby, the chassis 120 is completely pulled out as shown in FIG. 2.

Figure 6:
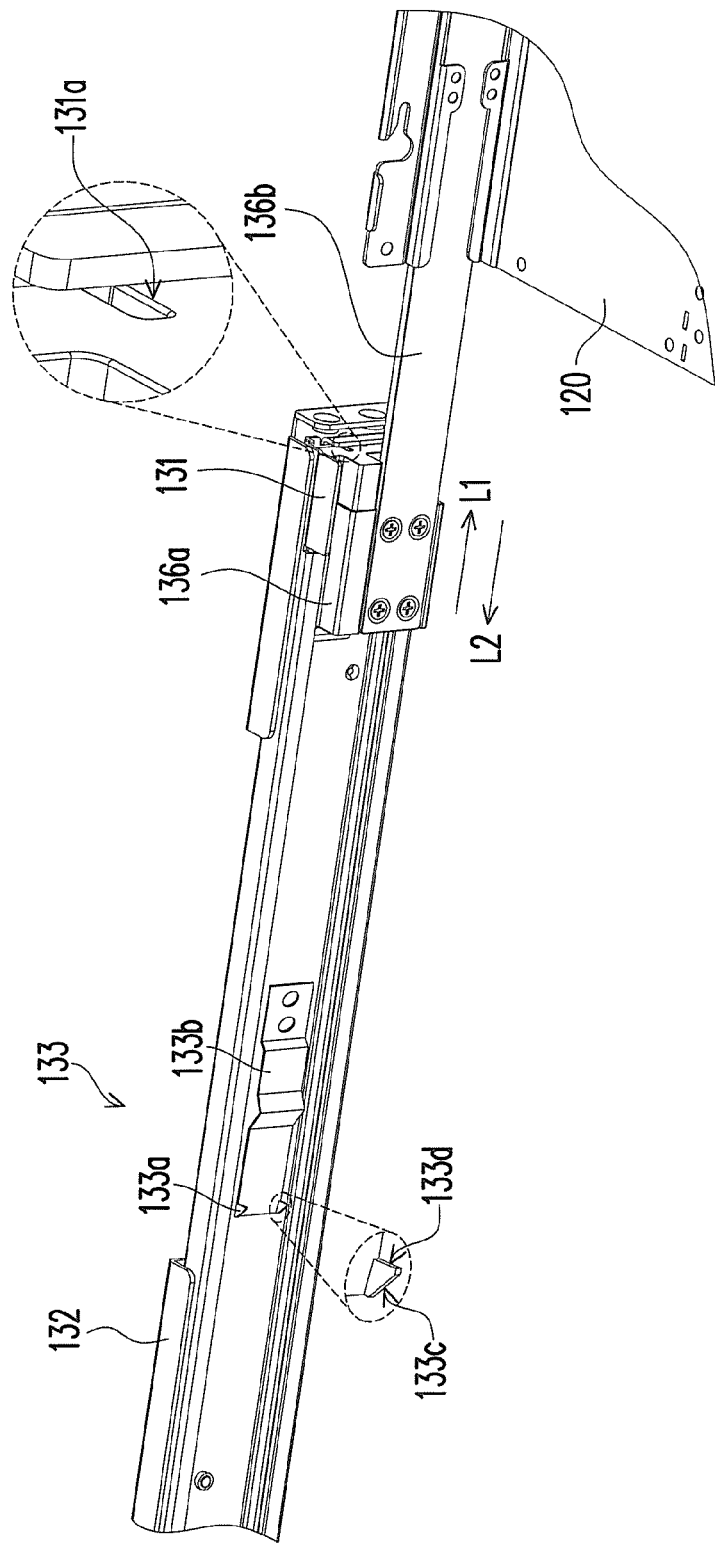
FIG. 6 is a partial enlarged view illustrating the server depicted in FIG. 2.

FIG. 6 is a partial enlarged view illustrating the server depicted in FIG. 2. In FIGS. 2 and 6, the rail device 130 of this embodiment further includes a second latch 133 which is, for example, an elastic sheet. The second latch 133 is located on a moving path of the slide block 136a and the driver 131. A side of the second latch 133 is mounted onto the first rail 132, and the other side of the second latch 133 is extended toward the chassis 120. The second latch 133 has a second stopper 133a and a pressing portion 133b. Here, the second stopper 133a has a sliding side 133c and a blocking side 133d.

To be more specific, the second stopper 133a is located on the moving path of the slide block 136a, and the sliding side 133c is in the same direction as a first sliding direction L1 of the slide block 136a. Hence, when the slide block 136a is moved at the first rail 132 in the first sliding direction L1, the slide block 136a can compress the second latch 133 along the sliding side 133c and pass through the second latch 133.

On the contrary, the blocking side 133d of the second latch 133 is in a direction perpendicular to a second sliding direction L2 of the slide block 136a. Thus, when the slide block 136a moves in the second sliding direction L2, the slide block 136a is blocked by the blocking side 133d. After the chassis 120 pushes the driver 131 to move in the second sliding direction L2 and contact the pressing portion 133b to compress the second latch 133, the blocking side 133d is moved away from the slide block 136a. As such, the slide block 136a can keep on moving along the second sliding direction L2. Moreover, it should be mentioned that the driver 131 has a groove 131a corresponding to the second stopper 133a. Therefore, when the driver 131 is moved along the second sliding direction L2, the driver 131 is not blocked by the second stopper 133a.

In light of the foregoing, the rail device in the server as described in the above embodiments of the invention is categorized into the first rail disposed on the rack and the second rail disposed in the chassis, such that the chassis can have relatively large internal space. In addition, to equip the server with advantages of the movable chassis, the first latch and the bracket are employed together in this invention. Thereby, when the chassis is pulled out, the chassis can move the bracket along the first rail. As such, the server can include the movable chassis and the relatively large accommodation space as its special features.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A rail device adapted for a server, the server comprising a rack and at least one chassis, the rail device being disposed on the chassis and the rack to move the chassis between a first position and a second position relative to the rack, the rail device comprising:

a first rail disposed on the rack;

a second rail disposed in the chassis;

a bracket slidably coupled to the first rail and the second rail, the bracket comprising:

a slide block slidably disposed at the first rail; and a supporter having a first end and a second end, the first end being mounted onto the slide block, the second end being slidably disposed at the second rail;

a first latch disposed on the supporter of the bracket, wherein when the chassis moves away from the first position, the first latch locks the bracket and the chassis together, such that the chassis pushes the bracket forward;

a driver slidably disposed at the first rail and slidably coupled to the supporter; and a second latch disposed at the first rail and located on a moving path of the slide block and the driver, the second latch having a second stopper and a pressing portion, wherein the second stopper blocks the slide block from moving to the first position of the chassis when the chassis moves from the second position to the first position, and the second latch unlocks the slide block when the driver contacts the pressing portion.

2. The rail device as claimed in claim 1, wherein the first rail has a first stopper, and the first stopper blocks movement of the bracket when the chassis pushes the bracket forward and moves the bracket to the second position.

3. The rail device as claimed in claim 1, the first latch having a buckling portion, the chassis having an opening, wherein the buckling portion is fastened to the opening when the chassis moves between the first position and the second position, and the buckling portion is moved away from the opening when the chassis moves to the second position, such that the chassis is disassembled from the supporter.

4. A server, comprising:

a rack;

at least one chassis;

a rail device disposed on the chassis and the rack to move the chassis between a first position and a second position relative to the rack, the rail device comprising:

a first rail disposed on the rack;

a second rail disposed in the chassis;

a bracket slidably coupled to the first rail and the second rail, the bracket comprising:

a slide block slidably disposed at the first rail; and a supporter having a first end and a second end, the first end being mounted onto the slide block, the second end being slidably disposed at the second rail;

a first latch disposed on the supporter of the bracket, wherein when the chassis moves away from the first position, the first latch locks the bracket and the chassis together, such that the chassis pushes the bracket forward;

a driver slidably disposed at the first rail and slidably coupled to the supporter; and a second latch disposed at the first rail and located on a moving path of the slide block and the driver, the second latch having a second stopper and a pressing portion, wherein the second stopper blocks the slide block from moving to the first position of the chassis when the chassis moves from the second position to the first position, and the second latch unlocks the slide block when the driver contacts the pressing portion.

5. The server as claimed in claim 4, wherein the first rail has a first stopper, and the first stopper blocks movement of the bracket when the chassis pushes the bracket forward and moves the bracket to the second position.

6. The server as claimed in claim 4, the first latch having a buckling portion, the chassis having an opening, wherein the buckling portion is fastened to the opening when the chassis moves between the first position and the second position, and the buckling portion is moved away from the opening when the chassis moves to the second position, such that the chassis is disassembled from the supporter.

* * * * *